United States Patent
Rowden et al.

(10) Patent No.: US 9,893,646 B2
(45) Date of Patent: Feb. 13, 2018

(54) SYSTEM FOR A LOW PROFILE, LOW INDUCTANCE POWER SWITCHING MODULE

(71) Applicant: General Electric Company, Schenectady, NY (US)

(72) Inventors: Brian Lynn Rowden, Ballston Lake, NY (US); Ljubisa Dragoljub Stevanovic, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 127 days.

(21) Appl. No.: 14/871,163

(22) Filed: Sep. 30, 2015

(65) Prior Publication Data

US 2017/0093302 A1    Mar. 30, 2017

(51) Int. Cl.
| | |
|---|---|
| *H01L 23/49* | (2006.01) |
| *H02M 7/537* | (2006.01) |
| *H05K 3/30* | (2006.01) |
| *H05K 7/02* | (2006.01) |
| *H01L 23/64* | (2006.01) |
| *H01L 25/07* | (2006.01) |

(Continued)

(52) U.S. Cl.
CPC .......... *H02M 7/537* (2013.01); *H01L 23/645* (2013.01); *H01L 25/072* (2013.01); *H02G 5/005* (2013.01); *H05K 3/30* (2013.01); *H05K 7/02* (2013.01); *H01L 25/18* (2013.01); *H02M 7/003* (2013.01)

(58) Field of Classification Search
CPC ............... H01L 23/49; H01L 23/49822; H01L 23/49827; H01L 25/18; H02M 7/537
See application file for complete search history.

(56) References Cited

U.S. PATENT DOCUMENTS

| 5,105,536 A | 4/1992 | Neugebauer et al. |
|---|---|---|
| 5,313,363 A | 5/1994 | Arbanas |

(Continued)

FOREIGN PATENT DOCUMENTS

| EP | 1160866 A2 | 12/2001 |
|---|---|---|
| EP | 1376696 A1 | 1/2004 |

OTHER PUBLICATIONS

International Search Report and Written Opinion issued in connection with corresponding Application No. PCT/US2016/045218 dated Oct. 28, 2016.

(Continued)

*Primary Examiner* — Phuc Dang
(74) *Attorney, Agent, or Firm* — Nitin N. Joshi

(57) ABSTRACT

A method and system for a power module device is provided. The device includes a base, a circuit board including a plurality of gated switches formed of a semiconductor material, and an electrical bus member configured to connect to a voltage source having a first polarity. The bus member includes a length that is substantially greater than a width of the bus member and the width is substantially greater than a thickness of the bus member. The power module device also includes a second bus member configured to connect to a voltage source having a second polarity. The second bus member is positioned in a nested face-to-face configuration with respect to the first bus member. The power module device further includes a layer of electrical insulation positioned between the first bus member and the second bus member.

12 Claims, 11 Drawing Sheets

(51) Int. Cl.
  *H02G 5/00* (2006.01)
  *H01L 25/18* (2006.01)
  *H02M 7/00* (2006.01)

(56) References Cited

U.S. PATENT DOCUMENTS

| | | |
|---|---|---|
| 5,388,028 A | 2/1995 | Arbanas |
| 6,456,516 B1 | 9/2002 | Bruckmann et al. |
| 7,187,568 B2 | 3/2007 | Radosevich et al. |
| 7,248,483 B2 | 7/2007 | West |
| 7,443,692 B2 | 10/2008 | Patwardhan et al. |
| 7,798,833 B2 | 9/2010 | Holbrook |
| 7,881,086 B2 | 2/2011 | Nakayama et al. |
| 7,907,385 B2 | 3/2011 | Korich et al. |
| 8,686,288 B2 | 4/2014 | Kalayjian et al. |
| 2002/0118560 A1 | 8/2002 | Ahmed et al. |
| 2005/0162875 A1 | 7/2005 | Rodriguez et al. |
| 2009/0015185 A1 | 1/2009 | Yoshida |
| 2013/0146128 A1* | 6/2013 | Yang .................. H01L 31/0516 136/251 |
| 2014/0133104 A1 | 5/2014 | Delgado et al. |
| 2016/0036360 A1* | 2/2016 | Maekawa ......... H02M 7/53873 318/400.13 |
| 2016/0079744 A1* | 3/2016 | Nagasawa ............ H05K 7/1432 361/699 |
| 2016/0308455 A1* | 10/2016 | Ratadiya .............. H05K 7/1432 |

OTHER PUBLICATIONS

Ariga Z N et al., "Laminated Bus Bar Structure for Low Induced Noise",Integrated Power Electronics Systems (CIPS), 2012 7th International Conference on, IEEE,pp. 1-6 Conference Location Nuremberg,Mar. 6-8, 2012.

Tsunoda T et al., "Low-inductance module construction for high speed, high-current IGBT module suitable for electric vehicle application",Power Semiconductor Devices and ICs, 1993. ISPSD '93., Proceedings of the 5th International Symposium on, IEEE,pp. 292-295;Conference Location :Monterey, CA, May 18-20, 1993.

\* cited by examiner

SYSTEM FOR A LOW PROFILE, LOW INDUCTANCE POWER SWITCHING MODULE

BACKGROUND

The field of the disclosure relates generally to power switching module assemblies and, more particularly, to power switching module assembly internal bus structures that provide low circuit inductance.

At least some known semiconductor power switching device packages route signals either on a power substrate or through metal traces in a wall geometry. For the power substrate, the signal paths are typically direct bond or active metal brazed copper or aluminum on a ceramic substrate which are single layer and require that the traces be adjacent to one another on a planar surface. The semiconductor devices are then wire bonded to the planar metal traces which run across the module and are wire bonded to the output terminals.

These known packages have typically tried to address higher operating frequencies and lower inductance packages solely with internal layout routing on a direct-bond-copper (DBC) substrate or within the side walls of the package. This includes an optimization of a length and a width of the metal traces and an orientation of the semiconductor devices. For some of the newer designs, planar bus bars have been used primarily in an orientation orthogonal to the DBC substrate with small tabs for making connection to the DBC surface. Although these constructions provide improvements, they are primarily geared toward reducing the number of wire bonds and improving manufacturing efficiency for standard silicon products. As more wide band gap semiconductors become available, the operation frequency and voltage levels continue to rise making parasitic packaging effects even more important. Wirebondless technologies such as thermal spray technologies, power overlay, and silver diffusion sintering joints may facilitate eliminating wire bonds and creating more planar interconnects, although most of these attempts require changes to the standard footprint either mechanically, electrically, or both to demonstrate the effect.

BRIEF DESCRIPTION

In one embodiment, a power module device is provided. The power module device includes a base, a circuit board including a plurality of gated switches formed of a semiconductor material, and a first elongate electrical bus member configured to connect to a voltage source having a first polarity. The first elongate electrical bus member includes a length, a width, and a thickness, the length being substantially greater than the width and the width being substantially greater than the thickness. The power module device also includes a second elongate electrical bus member configured to connect to a voltage source having a second polarity. The second elongate electrical bus member includes a length, a width, and a thickness, the length being substantially greater than the width and the width being substantially greater than the thickness. The second elongate electrical bus member is positioned in a nested face-to-face configuration with respect to the first elongate electrical bus member and a layer of electrical insulation is positioned between the first elongate electrical bus member and the second elongate electrical bus member.

In another embodiment, a method of forming a power module device is provided. The method includes providing a base including a cavity formed of a planar bottom and sidewalls extending orthogonally away from the planar bottom. The base includes a contact ledge extending orthogonally away from at least one sidewall. The method also includes positioning a component board adjacent the planar bottom wherein the component board includes a plurality of semiconductor devices formed of a wide band-gap material positioned in a plurality of groups. Each group includes a portion of the plurality of semiconductor devices and each portion forming a semiconductor switch. The method also includes positioning a first electrical bus of a first polarity adjacent the component board, the first electrical bus extending outside the cavity onto the contact ledge and positioning a second electrical bus of a second polarity adjacent and overlapping the electrical bus of the first polarity, the second electrical bus extending outside the cavity onto the contact ledge and maintaining the overlap of the first electrical bus on the contact ledge. The method further includes extending a layer of insulation between the first electrical bus and the second electrical bus along an entire length of overlap of the first electrical bus and the second electrical bus, the layer of insulation extending outside the cavity at least partially covering a surface of a terminal of the first electrical bus and the second electrical bus.

In yet another embodiment, an inverter system is provided. The inverter system includes a direct current (DC) power source and a power switching module electrically coupled to the DC power source. The power switching module is configured to receive DC power from the DC power source and generate alternating current (AC) output. The power switching module includes a base including a cavity formed of a planar bottom and sidewalls extending orthogonally away from the planar bottom. The base includes a contact ledge extending orthogonally away from at least one sidewall. The method further includes positioning a component board adjacent the planar bottom. The component board includes a plurality of semiconductor devices formed of a wide band-gap material positioned in a plurality of groups. Each group includes a portion of the plurality of semiconductor devices. Each portion forms a semiconductor switch. The method also includes positioning a first electrical bus of a first polarity adjacent the component board. The first electrical bus extends outside the cavity onto the contact ledge. The method includes positioning a second electrical bus of a second polarity adjacent and overlapping the electrical bus of the first polarity. The second electrical bus extends outside the cavity onto the contact ledge. The method includes maintaining the overlap of the first electrical bus on the contact ledge. The method further includes extending a layer of insulation between the first electrical bus and the second electrical bus along an entire length of overlap of the first electrical bus and the second electrical bus. The layer of insulation extending outside the cavity at least partially covers a surface of a terminal of the first electrical bus and the second electrical bus.

DRAWINGS

These and other features, aspects, and advantages of the present disclosure will become better understood when the following detailed description is read with reference to the accompanying drawings in which like characters represent like parts throughout the drawings, wherein.

Figure 1:
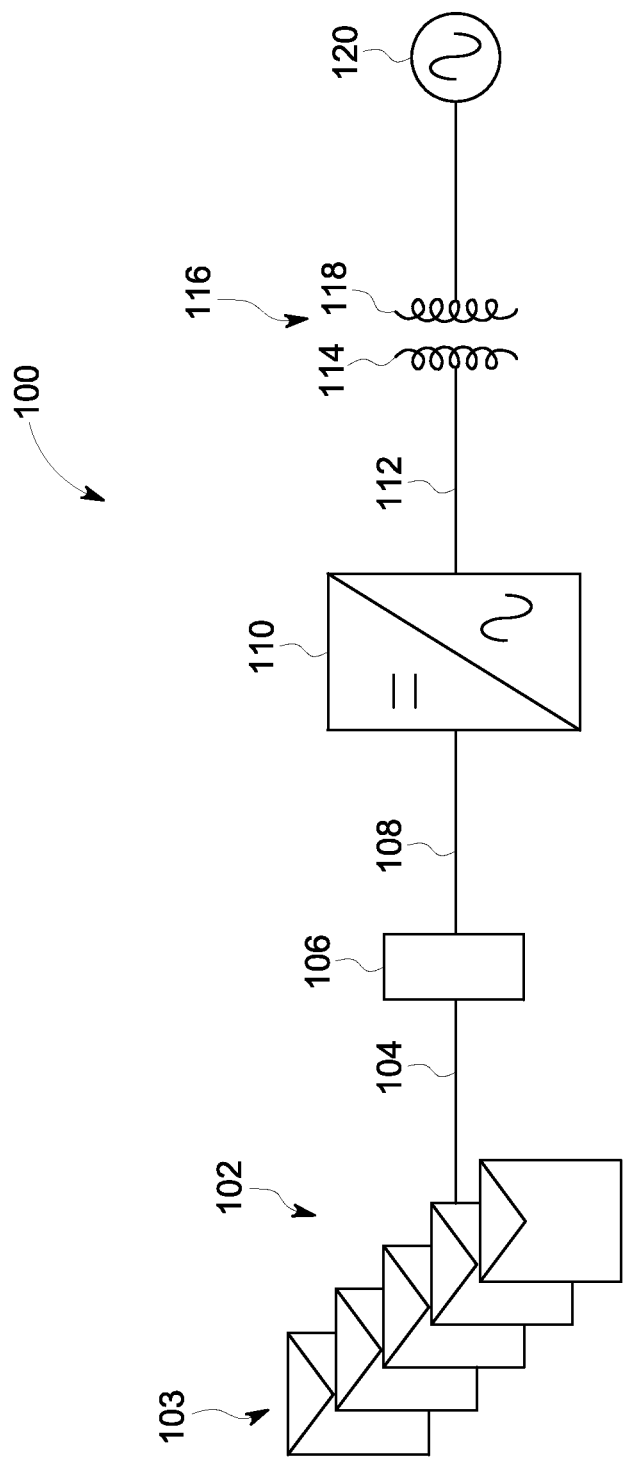
FIG. 1 is schematic block diagram of a power inverter system.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure describe a low inductance packaging solution to enable fast switching and full utilization of wide band-gap semiconductor device technology in a standard high volume industrial package. Examples of wide band-gap semiconductor devices include those formed of silicon carbide (SiC), Aluminum nitride (AlN), Gallium nitride (GaN), and diamond. The package design described herein provides a low inductance routing for the main commutation loop from the device to the system, enabling higher switching speeds with minimal voltage overshoot due to package parasitic effects. The low inductance path includes an internal laminated bus structure which overlaps the positive and negative bus providing field cancellation in the overlapped region. To significantly reduce the inductance, this overlapped laminated structure extends into the mounting terminal area resulting in considerable reduction in the total module inductance. For example, the module inductance is reduced by approximately 75% as compared to current industrial silicon modules. This provides the capability to switch at faster speeds with lower voltage overshoot, parasitic ringing, and power losses to extend the device usage to higher voltages, frequencies, and power levels. This is also true for the gate routing and source kelvin connections, providing lower inductance paths between the gatedriver and the gates of individual devices.

Figure 2:
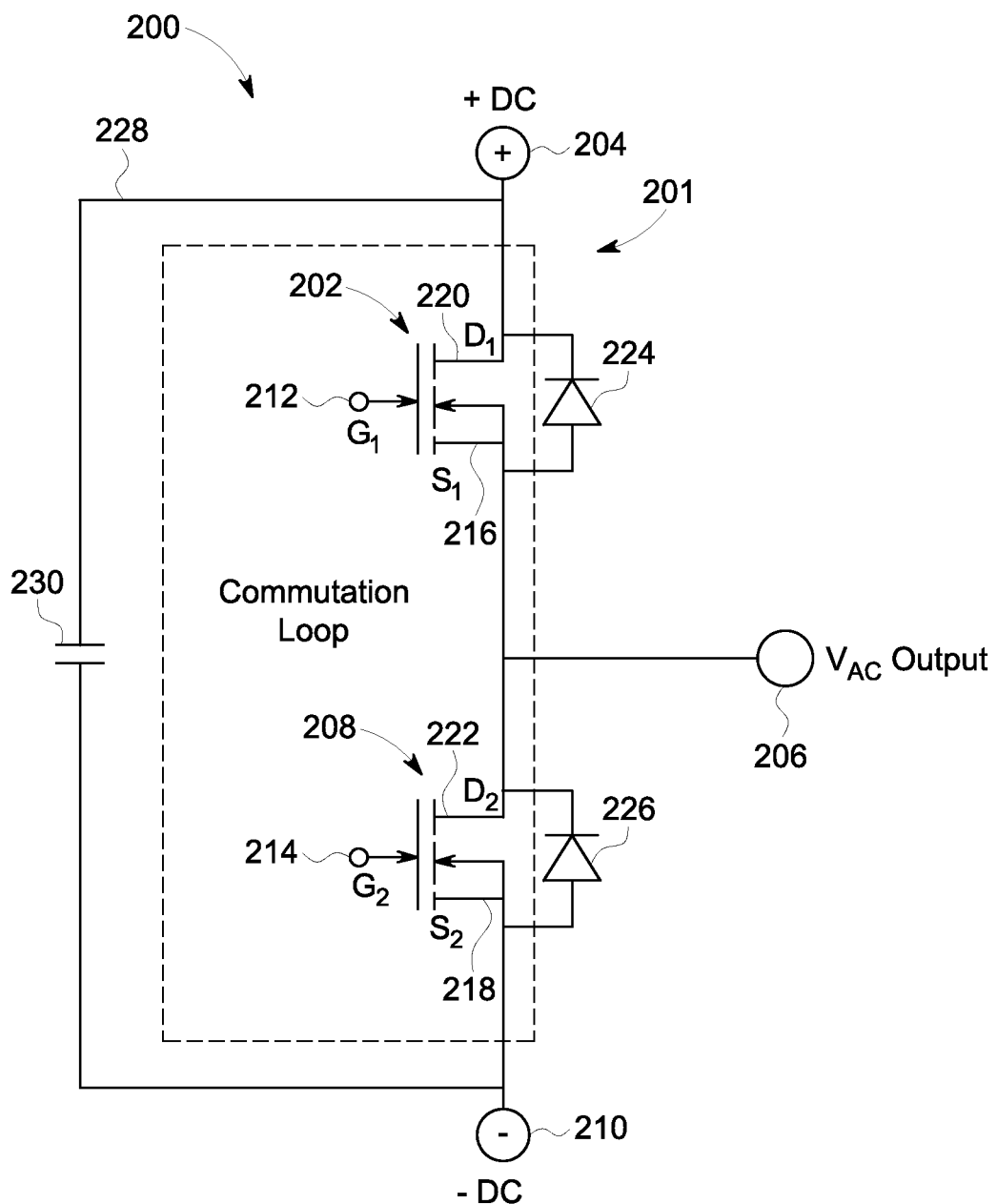
FIG. 2 is a schematic diagram of a commutation loop of a power switching circuit that may be used with the inverter shown in FIG. 1.
Figure 6:
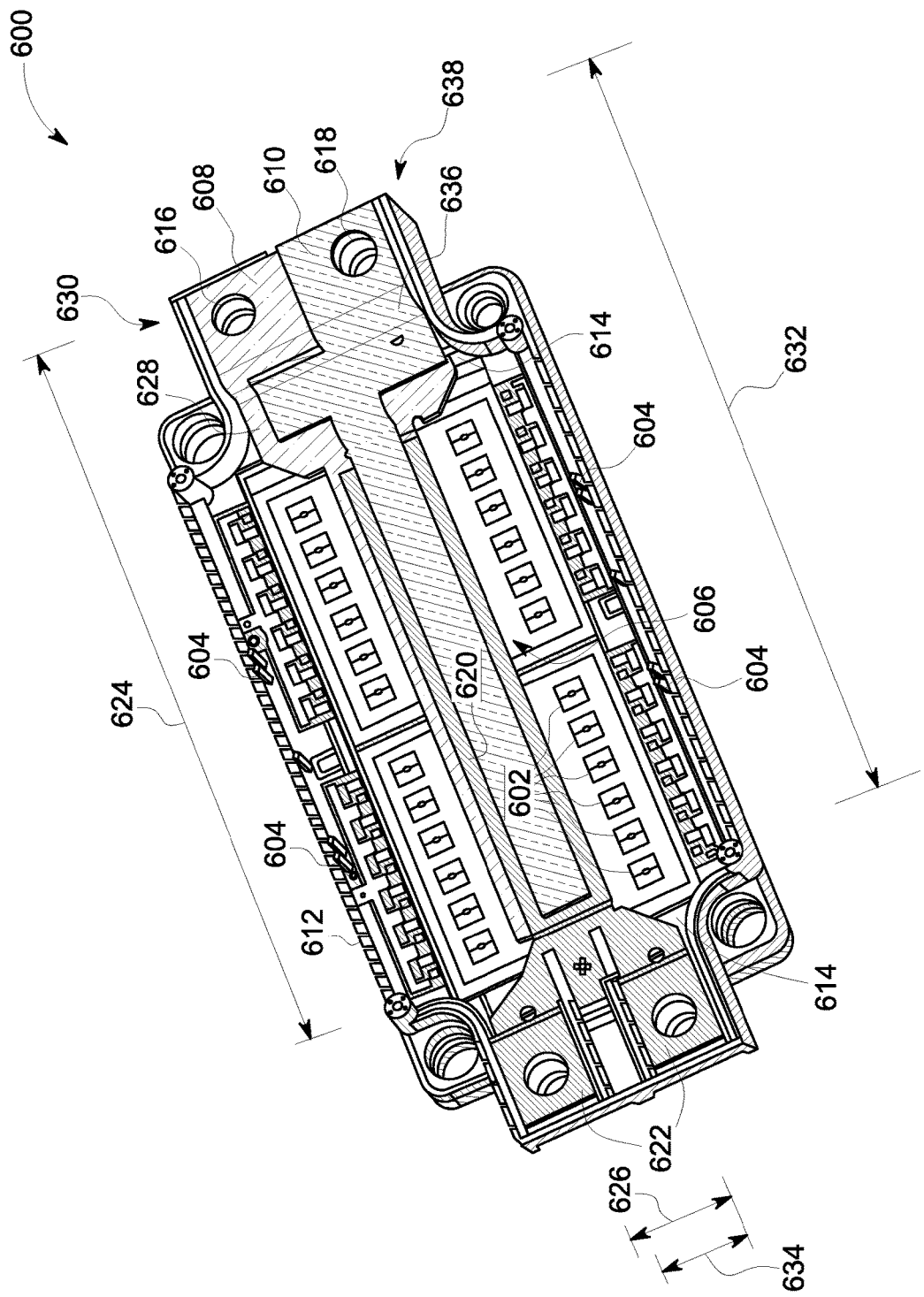
FIG. 6 is a perspective view of a power module device configured to enclose the power switching circuit shown in FIG. 3 and related components.

To maximize the efficiency and the reliability of a semiconductor device, the surrounding packaging which connects this device to the system must introduce minimal parasitic impedance. The parasitic impedance can be any combination of resistive, inductive, or capacitive which contribute to system losses or have a detrimental impact on the capability of the device either electrically, thermally, or mechanically. This is particularly true in device and package-level interconnects for multichip modules where several devices must be parallel/series connected to achieve the required voltage and current rating. For power modules, the interconnects from devices are typically performed with wire bonding to copper traces routed on insulating substrates called direct bond copper (DBC). This type of configuration is shown in FIGS. 6 and 7. The routing on the DBC is easy to implement by simply patterning the DBC substrate copper surfaces to create the current paths throughout the power module. Due to manufacturing process and voltage breakdown requirements, there is a minimum required spacing between these routing planes on the DBC, which limits the module packaging density. Additionally, the thickness of copper in the DBC construction is usually approximately 0.3 mm which impacts the current density and electrical resistance the routing planes. The parasitic impedance of the interconnect is dependent on the wire bond diameter, length, and quantity in addition to the geometry of the routing plane and electromagnetic coupling between the routing plane and other conductive paths. For power modules, the main or commutation power loop is the path of primary concern as this is shown in FIG. 2 with current flowing from the positive DC terminals through the module and out the negative DC terminal. There are several paths for the current to take in this configuration due to the parallel connection of several devices, each parallel device connection having a specific inductance, capacitance, and resistance based on the geometry (length, width, thickness) and proximity to other conductive paths.

With the laminated bus structure and module layout shown in FIGS. 6, 7, 8, and 9, the positive and negative bus are directly on top of one another which creates a field canceling as current is circulating through the bus. There are also fewer wire bonds and wire bond distances from the semiconductor to the bus structure are shorter, which further reduces the parasitic inductance in the loop. In addition, the full lamination of the bus geometries from within the module and extending external of the module to the mounting terminals provides reduced inductance. The laminated bus structure internal to the module only yields an improvement of about 20% whereas extending that geometry outside to the mounting terminals reduces the module inductance by about 75%. For gate structures, the routing lines are typically relatively long between the semiconductor chip to the output pin and the relative length between routing lines can be significantly different with respect to each other based on the chip location to the output pin. In embodiments of the structure described herein, the gate and gate return are implemented in a printed circuit board sub-assembly which includes the gate resistors close to the gate bond area as well as a gate return path laminated directly below this gate signal plane, again providing a level of field canceling over the common areas.

FIG. 1 is schematic block diagram of a power inverter system 100. In the exemplary embodiment, power inverter system 100 includes a power source, such as, but, not limited to, a plurality of solar panels 102 arranged in an array 103. Solar panels 102 are electrically coupled together in a series, parallel, or series/parallel combination. A corresponding plurality of outputs 104 of solar panels 102 are electrically coupled to one or more combiner boxes 106 configured to receive outputs 104 and to generate a lesser number of combiner box outputs 108. Typically, all of outputs 104 from array 103 are combined into single output 108. An inverter 110 is configured to receive output 108 and generate an alternating current (AC) output 112, which is applied to a primary winding 114 of a step-up transformer 116. Electrical energy at a higher voltage than output 112 is generated in a secondary winding 118 and transmitted to a load 120.

FIG. 2 is a schematic diagram of a commutation loop 200 of a power switching circuit 201 that may be used with inverter 110 (shown in FIG. 1). In the exemplary embodiment, power switching circuit 201 is represented by a first switch 202 electrically coupled between a positive (+) DC terminal 204 and a $V_{AC}$ Output terminal 206 and a second switch 208 electrically coupled between a negative (−) DC terminal 210 and $V_{AC}$ Output terminal 206. In various embodiments, switches 202 and 208 are embodied in metal oxide semiconductor field effect transistors (MOSFET), insulated-gate bipolar transistors (IGBT), junction gate field-effect transistors (JFET), or bipolar junction transistors (BJT) formed of a wide band gap semiconductor material, such as, but, not limited to, silicon carbide (SiC), Aluminum nitride (AlN), Gallium nitride (GaN), and Boron nitride (BN).

Each of switches 202 and 208 include a control terminal, such as, gates 212 and 214, respectively. Each of switches 202 and 208 also include a path for current flow through respective source terminals 216 and 218 and respective drain terminals 220 and 222. Antiparallel diodes 224 and 226 are positioned in electrical parallel to a respective one of switches 202 and 208.

Capacitance of a circuit 228 external to power switching circuit 201 is represented by a capacitor 230. The equivalent impedance of commutation loop 200 is a function of capacitor 230, an inductance of power switching circuit 201 and the conductive leads between positive (+) DC terminal 204 and negative (−) DC terminal 210, and any resistance in commutation loop 201.

During operation, switches 202 and 208 are controlled using gates 212 and 214, respectively to conduct alternately to generate an AC voltage at $V_{AC}$ Output terminal 206. During switching transients, antiparallel diodes 224 and 226 bleed excess current between respective source terminal 216 and drain terminal 220 and source terminal 218 and drain terminal 222.

Figure 3:
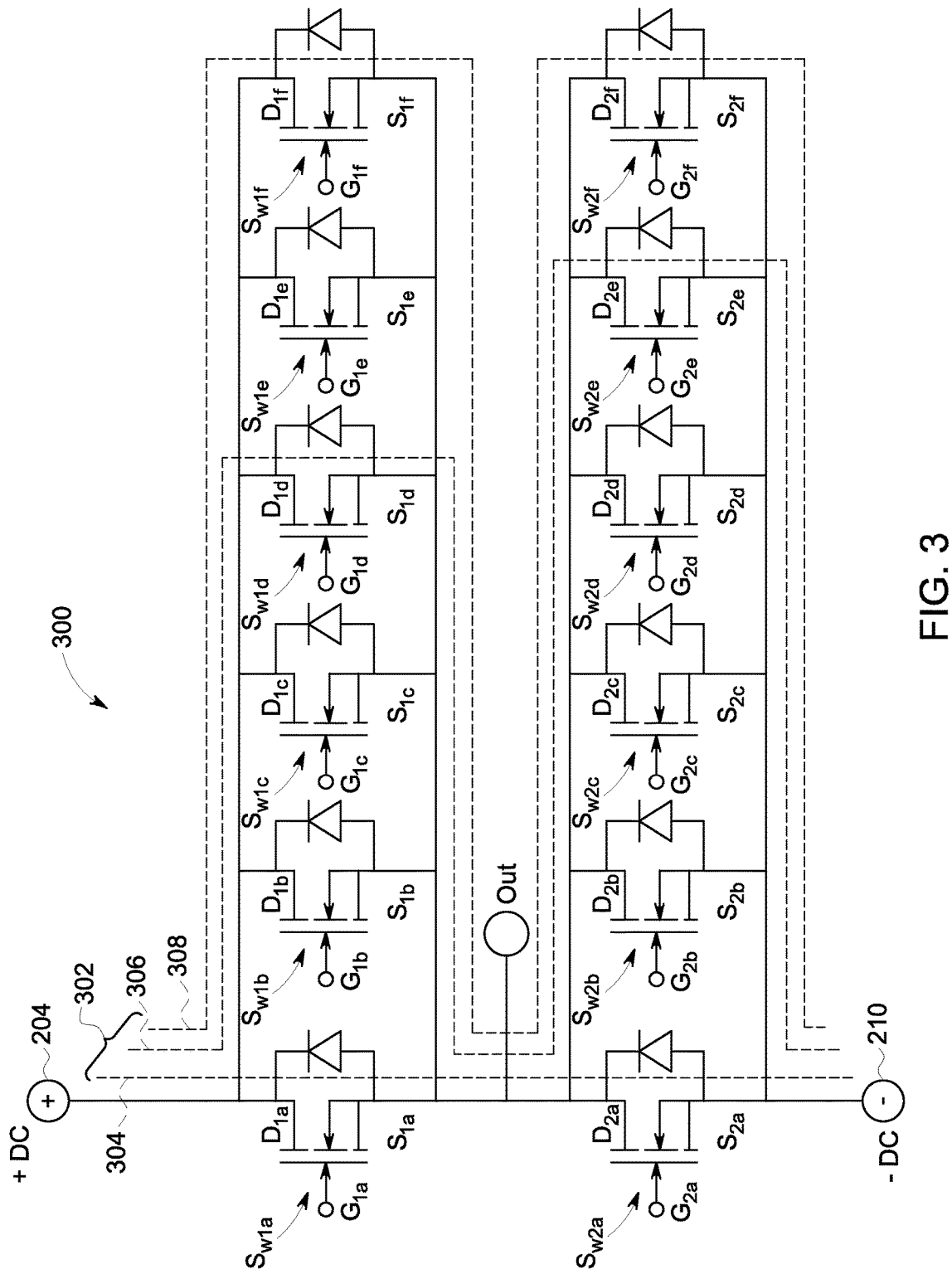
FIG. 3 is a schematic diagram of a power switching circuit that may be used with inverter shown in FIG. 1.

FIG. 3 is a schematic diagram of a power switching circuit 300 that may be used with inverter 110 (shown in FIG. 1). In the exemplary embodiment, power switching circuit 300 includes a plurality of commutated gated switches or power switching devices, such as, but, not limited to, silicon carbide (SiC) based MOSFETs, $Sw_{1a}$-$Sw_{1f}$ and $Sw_{2a}$-$Sw_{2f}$. To enhance a performance of power switching circuit 300, the surrounding packaging which connects power switching circuit 300 to other components of inverter 110 (shown in FIG. 1) are configured to have minimal parasitic impact.

In general, the parasitic nature of packaging can be any combination of resistive, inductive, or capacitive effects, which contribute to power switching circuit 300 losses or limit the capability of power switching circuit 300 electrically, thermally, or mechanically. This is particularly true in device and package level interconnects for multichip modules where several power switching devices are parallel/series connected to achieve a required voltage and current rating. For power modules (not shown in FIG. 3), the interconnects from devices are typically performed with wire bonding to copper traces routed on insulating substrates called direct bond copper (DBC). The routing on the DBC is easy to perform in high volume and provides the current paths throughout the power module, but due to manufacturing process and voltage breakdown requirements, there is increased spacing between these routing planes which corresponds to longer wire bonds. Additionally, the thickness of copper in the DBC construction is usually approximately 0.3 mm which impacts the current density and electrical resistance of this current path. The parasitic nature of the interconnect is dependent on the wire bond diameter, length, and quantity in addition to the geometry of the current carrying path and coupling along the path and dielectrics utilized.

In the example embodiment, for power modules, discussed further below, a main or commutation power loop path 302 is the path of primary concern. In the exemplary embodiment, three commutation power loop paths 302 are illustrated, a first path 304, a second path 306, and a third path 308 with current flowing from positive DC terminal 204 through power switching circuit 300 and out negative DC terminal 210. There are several paths, in addition to paths 304, 306, and 308, for the current to take in this configuration due to the parallel devices with each associated with an inductance and resistance based on the geometry (length, width, thickness) and proximity to other conductors in the path. First path 304, second path 306, and third path 308 illustrate some of the available paths for current flow through this configuration.

Figure 4:
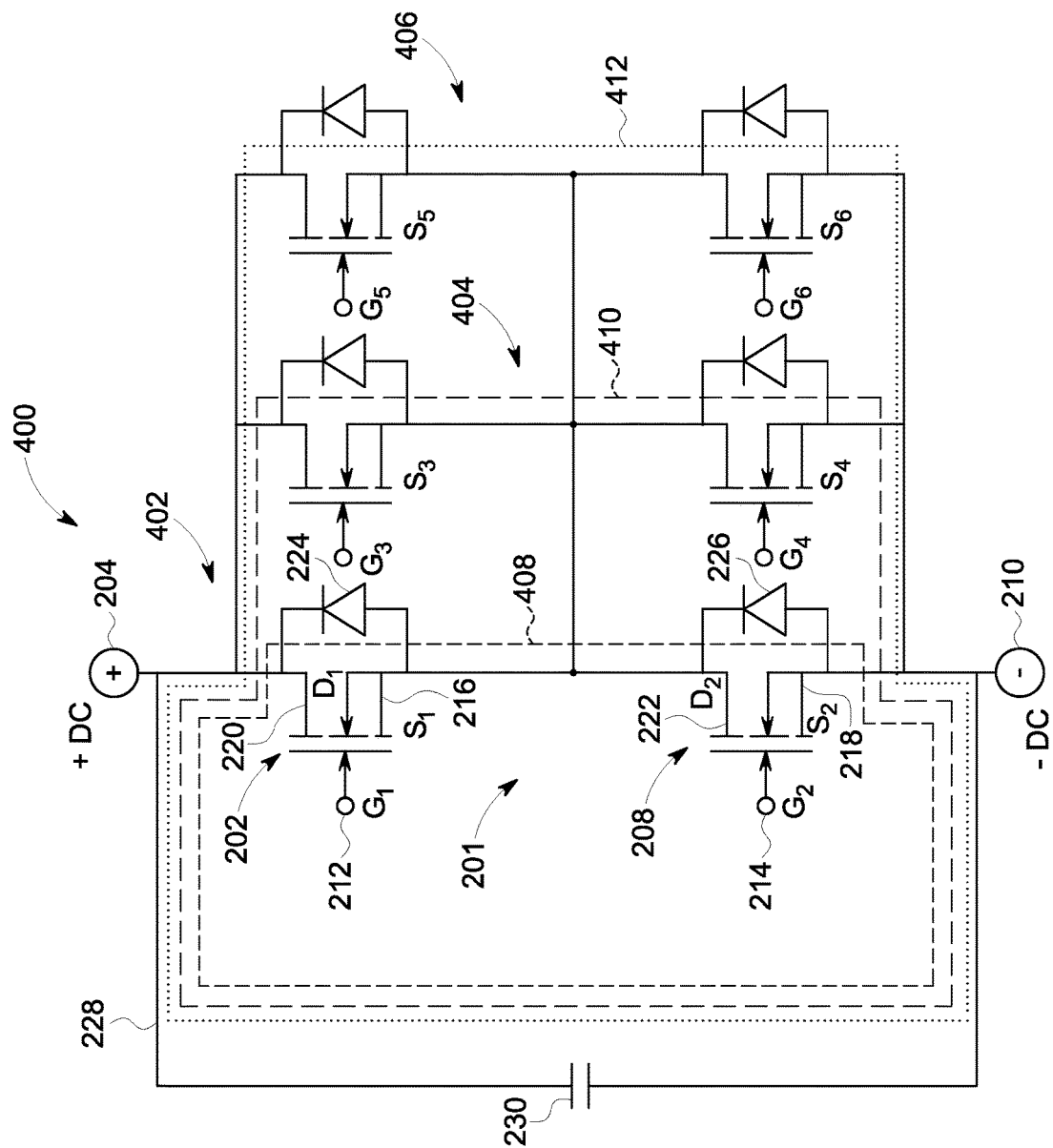
FIG. 4 is a schematic diagram of an alternative power switching circuit that may be used with inverter shown in FIG. 1.

FIG. 4 is a schematic diagram of an alternative power switching circuit 400 that may be used with inverter 110 (shown in FIG. 1). In the exemplary embodiment, a first portion 402 of power switching circuit 400 is substantially similar to power switching circuit 201 (shown in FIG. 2). Reference numerals used to identify components in FIG. 4 that correspond to like components in FIG. 2 are identified in FIG. 4 using the same numerals used in FIG. 2.

Power switching circuit 400 includes a second power switching circuit 404 and a third power switching circuit 406 coupled in electrical parallel with power switching circuit 201. Accordingly, power switching circuit 400 is a three-phase embodiment of power switching circuit 201. Three commutation power loop paths are illustrated, a first path 408, a second path 410, and a third path 412 with current flowing from positive DC terminal 204 through power switching circuit 400 and out negative DC terminal 210.

During operation, it is desirable to have the current flowing through each of commutation power loop path 408, commutation power loop path 410, and commutation power loop path 412 to be approximately equal. Such balance between commutation power loop paths 408, 410, and 412 is accomplished when an impedance through each of switching circuits 201, 404, and 406 is approximately equal with respect to each other of switching circuits 201, 404, and 406. Moreover, a reduced impedance in each of switching circuits 201, 404, and 406 also facilitates matching impedance amongst switching circuits 201, 404, and 406. In the example embodiment, conductors forming each of switching circuits 201, 404, and 406 and positive DC terminal 204, and negative DC terminal 210 are positioned in close physical proximity and aligned with current flowing in adjacent conductors being oppositely directed. In this manner, an electromagnetic field generated in each conductor due to the current flow will tend to cancel each other electromagnetic field generated in each other adjacent conductor having opposite current flow. Cancellation of the electromagnetic fields reduces the inductance in those conductors thereby reducing the impedance of each of switching circuits 201, 404, and 406. Reducing the inductance in power switching circuit 400 also improves the performance of power switching circuit 400 at very high frequency operation.

Figure 5:
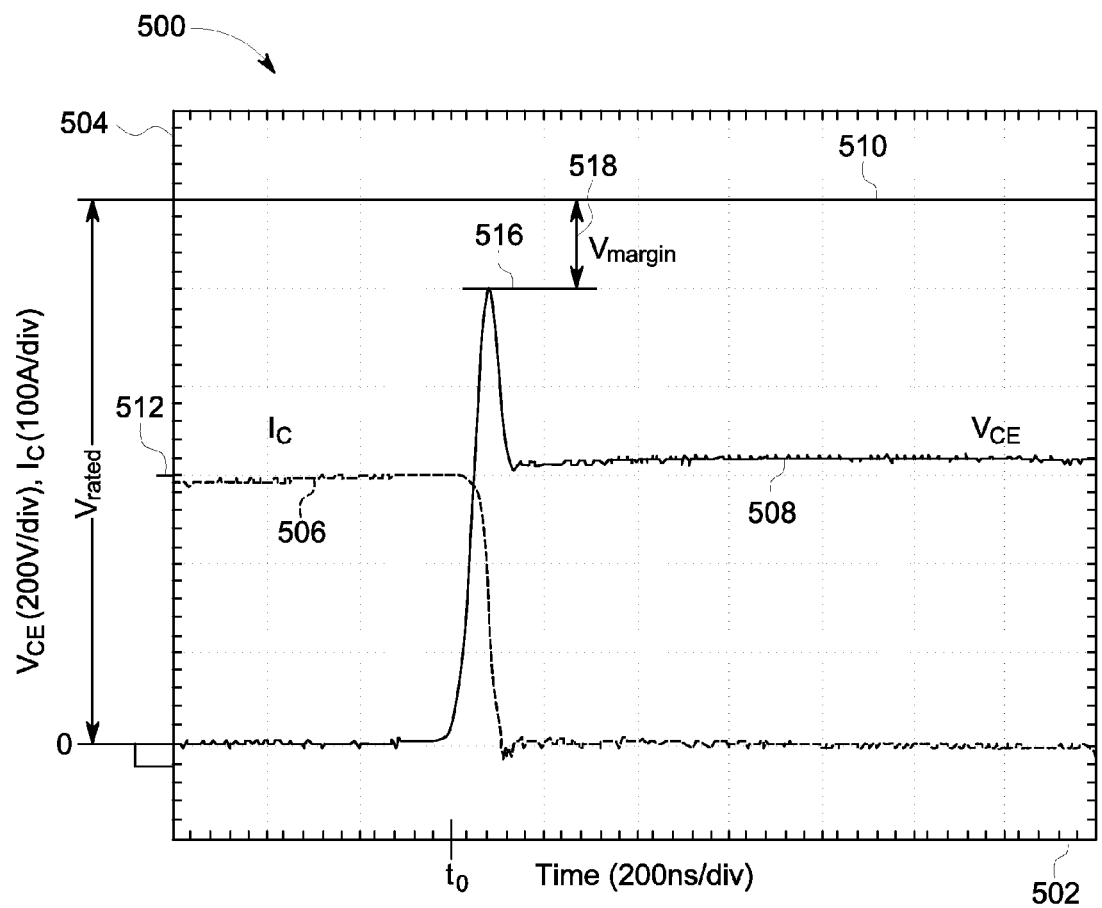
FIG. 5 is a graph of switch voltage and current during a turn-off transient.

FIG. 5 is a graph 500 of switch voltage and current during a transient. Graph 500 includes an x-axis 502 graduated in units of time (nanoseconds) and a y-axis 504 graduated in units of current (Amperes) and voltage (Volts). A trace 506 illustrates an amount of current passing through the switch, for example, any of $Sw_{1a}$-$Sw_{1f}$ and $Sw_{2a}$-$Sw_{2f}$ (shown in FIG. 4) during a switching transient. A trace 508 illustrates an amount of voltage across the switch as a result of the switching transient. A line 510 indicates a voltage level that the switch is rated for. In some embodiments, a requirement is for an anticipated voltage for any transient to only be up to 50% of the rated voltage. In other embodiments, another margin requirement may be specified.

During operation, current through the switch is at a first current value 512 and voltage across the switch is at a first voltage value 514. At a time zero ($t_0$), the switch is turned off and the current quickly attains an approximately zero value at time one ($t_1$). At $t_1$, the voltage spikes to a level determined, among other things by the inductance (L) of the circuit and the rate of change of the current (di/dt). In the example embodiment, the voltage spikes to a second voltage level 516. The difference between first voltage value 514 and second voltage level 516 indicates a voltage margin 518 of the switch for that switching transient. Given the higher frequency capabilities of wide band-gap semiconductor materials, which leads to a higher di/dt component, it is important to reduce the inductance of the switching and/or commutation circuits to avoid approaching the rated voltage limits for the switch.

FIG. 6 is a perspective view of a power module device 600 configured to enclose power switching circuit 300 (shown in FIG. 3) and related components. In the exemplary embodiment, power module device 600 is configured to reduce the parasitic inductance for both main commutation power loop 302 (shown in FIG. 3) as well as a gate signal loop (not shown) from individual power switching devices 602 to a respective driver 604. To reduce the inductance, the current paths in and out of the module are maintained in close proximity with respect to each other so that an induced flux generated in each path when current flows through the modules are equal and opposite thus canceling each other out and reducing the overall parasitic inductance seen by main commutation power loop 302 (shown in FIG. 3). To avoid spacing and separation requirements when routing traces in the DBC, a laminated bus structure 606 internal to power module device 600 is used. Laminated bus structure 606 permits a positive bus 608 and a negative bus 610 to be located directly on top of one another with only wire bonding ledges impacting an overlap of positive bus 608 and negative bus 610. Polymer based insulation layers (not shown) positioned between positive bus 608 and negative bus 610 also facilitate reducing a distance between positive bus 608 and negative bus 610 to further reduce the inductance. In various embodiments, the electrical insulation layer is embodied in a polyimide film, flexible ceramics, hybrid polymer ceramic, and an adhesive, such as, but, not limited to, a fluoropolymer adhesive and a silicone compatible adhesive, such as, but, not limited to Kapton®. Laminated bus structure 606 also allows for relatively short and very consistent wire bond lengths between power switching devices 602 to further reduce the inductance of the interconnect to power module device 600 and resistance under switching conditions. In traditional industrial power modules, a standard inductance is approximately 20 nH. Positive bus 608 is an elongate member or strip that includes a length 624, a width 626, which is substantially less than length 624, a thickness oriented into and out of the page and that is substantially less than width 626, and a flared portion 628 at a terminal end 630. Negative bus 610 is an elongate member or strip that includes a length 632, a width 634, which is substantially less than length 632, a thickness, oriented into and out of the page, that is substantially less than width 634, and a flared portion 636 at a terminal end 630 of a base 638.

Figure 7A:
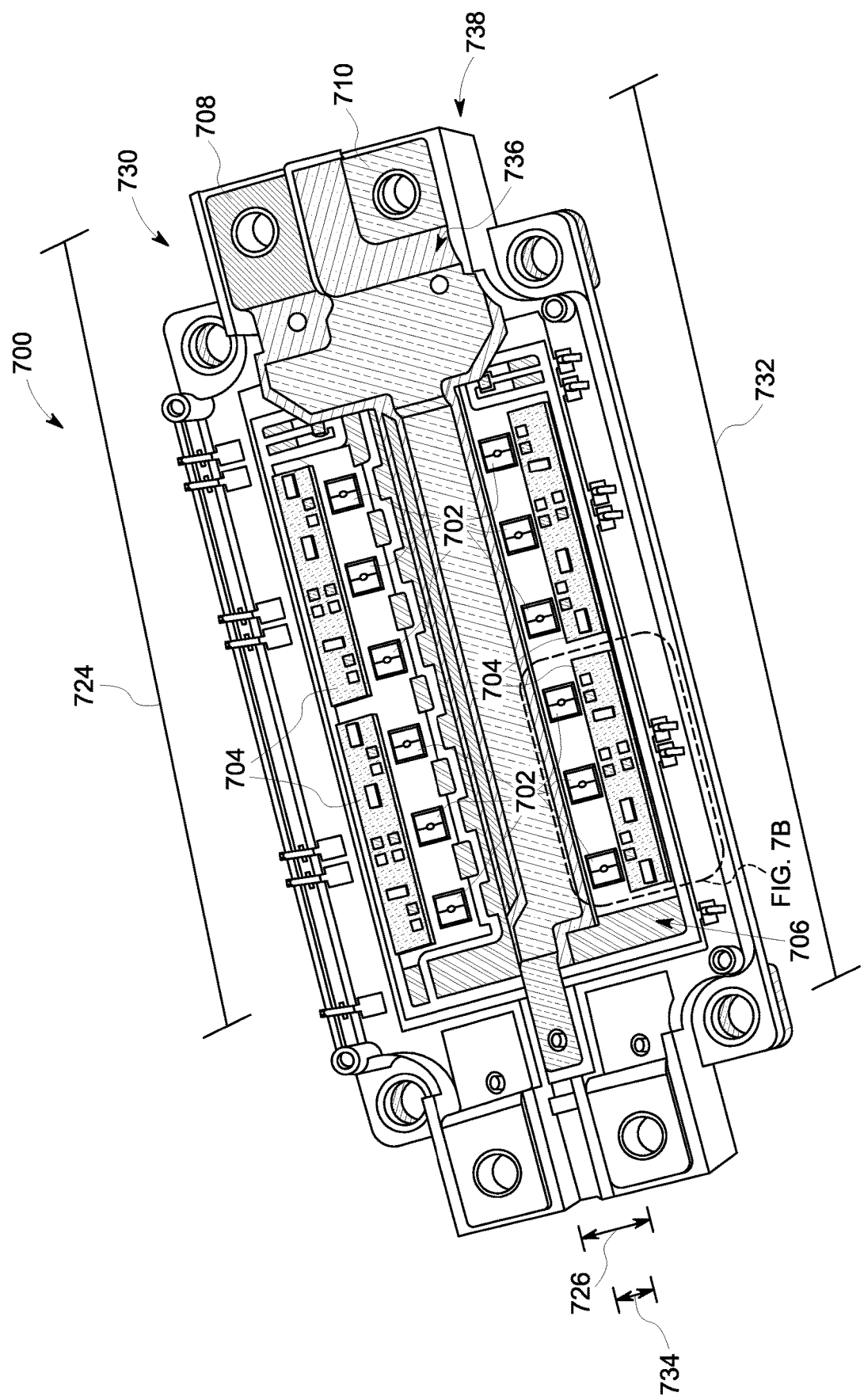
FIG. 7A is a perspective view of an alternative embodiment of a power module device configured to enclose the power switching circuit shown in FIG. 3 and related components.

FIG. 7A is a perspective view of a power module device 700 configured to enclose power switching circuit 400 (shown in FIG. 4) and related components. In the exemplary embodiment, power module device 700 is configured to reduce the parasitic inductance for both commutation power loop paths 408, 410, and 412 (shown in FIG. 4) as well as a respective gate signal loop (shown in FIG. 7B) from individual power switching devices 702 to a respective driver board 704. To reduce the inductance, the current paths in and out of the module are maintained in close proximity with respect to each other so that an induced flux generated in each path when current flows through the modules are equal and opposite thus canceling each other out and reducing the overall parasitic inductance seen by commutation power loop paths 408, 410, and 412 (shown in FIG. 4). To avoid spacing and separation requirements when routing traces in the DBC, a laminated bus structure 706 internal to power module device 700 is used. Laminated bus structure 706 permits a positive bus 708 and a negative bus 710 to be located directly on top of one another with only wire bonding ledges impacting an overlap of positive bus 708 and negative bus 710. Polymer based insulation layers (not shown) positioned between positive bus 708 and negative bus 710 also facilitate reducing a distance between positive bus 708 and negative bus 710 to further reduce the inductance. In various embodiments, the electrical insulation layer is embodied in a polyimide film, flexible ceramics, hybrid polymer ceramic, and an adhesive, such as, but, not limited to, a fluoropolymer adhesive and a silicone compatible adhesive, such as, but, not limited to Kapton®. Laminated bus structure 706 also allows for relatively short and very consistent wire bond lengths between power switching devices 702 to further reduce the inductance of the interconnect to power module device 700 and resistance under switching conditions. In traditional industrial power modules, a standard inductance is approximately 20 nH. Positive bus 708 is an elongate member or strip that includes a length 724, a width 726, which is substantially less than length 724, a thickness oriented into and out of the page and that is substantially less than width 726, and a flared portion (not shown) at a terminal end 730. Negative bus 710 is an elongate member or strip that includes a length 732, a width 734, which is substantially less than length 732, a thickness, oriented into and out of the page, that is substantially less than width 734, and a flared portion 736 at terminal end 730 of a base 738.

Figure 7B:
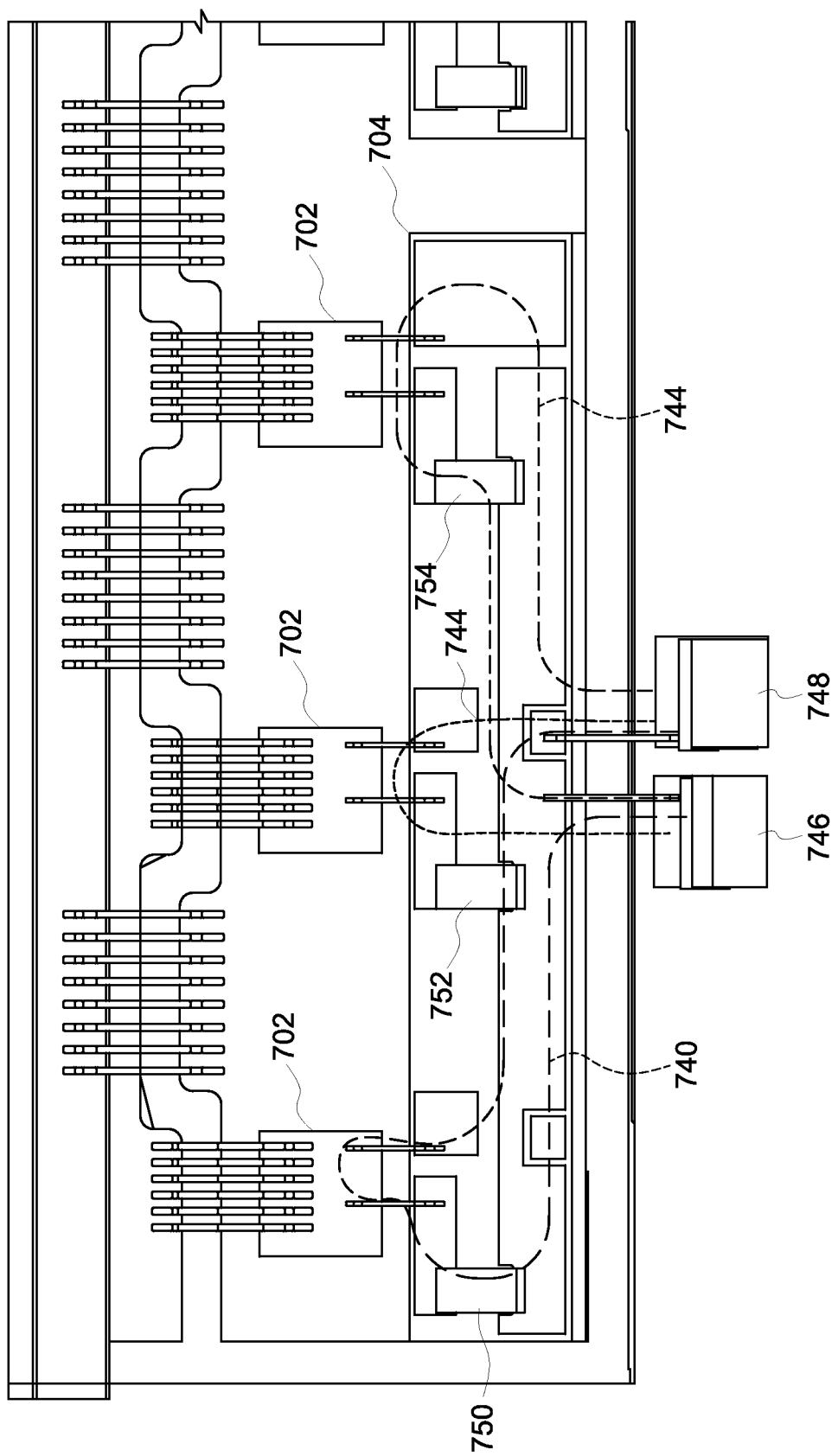
FIG. 7B is an enlarged view of the driver board and the gate signal loops from the individual power switching devices to a respective driver board.

FIG. 7B is an enlarged view of driver board 704 and the gate signal loops from individual power switching devices 702 to a respective driver board 704. In the example embodiment, each of three gate signal loops, 740, 742, and 744 are connected to signal input pins 746 and 748. Signal input pins 746 and 748 are connected to lands on driver board 704, which are connected to each respective driver 750, 752, and 754 through traces formed in driver board 704. Each respective driver 750, 752, and 754 is connected to a respective power switching devices 702 through lands on driver board 704. In the example embodiment, a length of the electrical connections between each respective driver 750, 752, and 754 and power switching devices 702 is as short as practicable and approximately identical, which facilitates reducing and approximately matching an impedance in gate signal loops, 740, 742, and 744. Matching impedances and circuit lengths in gate signal loops, 740, 742, and 744 also prevents a timing mismatch between power switching devices 702. For example, a power switching device 702 having a longer circuit length would be delayed in time from switching as would a power switching device 702 having a relatively shorter circuit length. Such delay could cause the power switching device 702 having a relatively shorter circuit length to assume more of the load of power module device 700.

Figure 8:
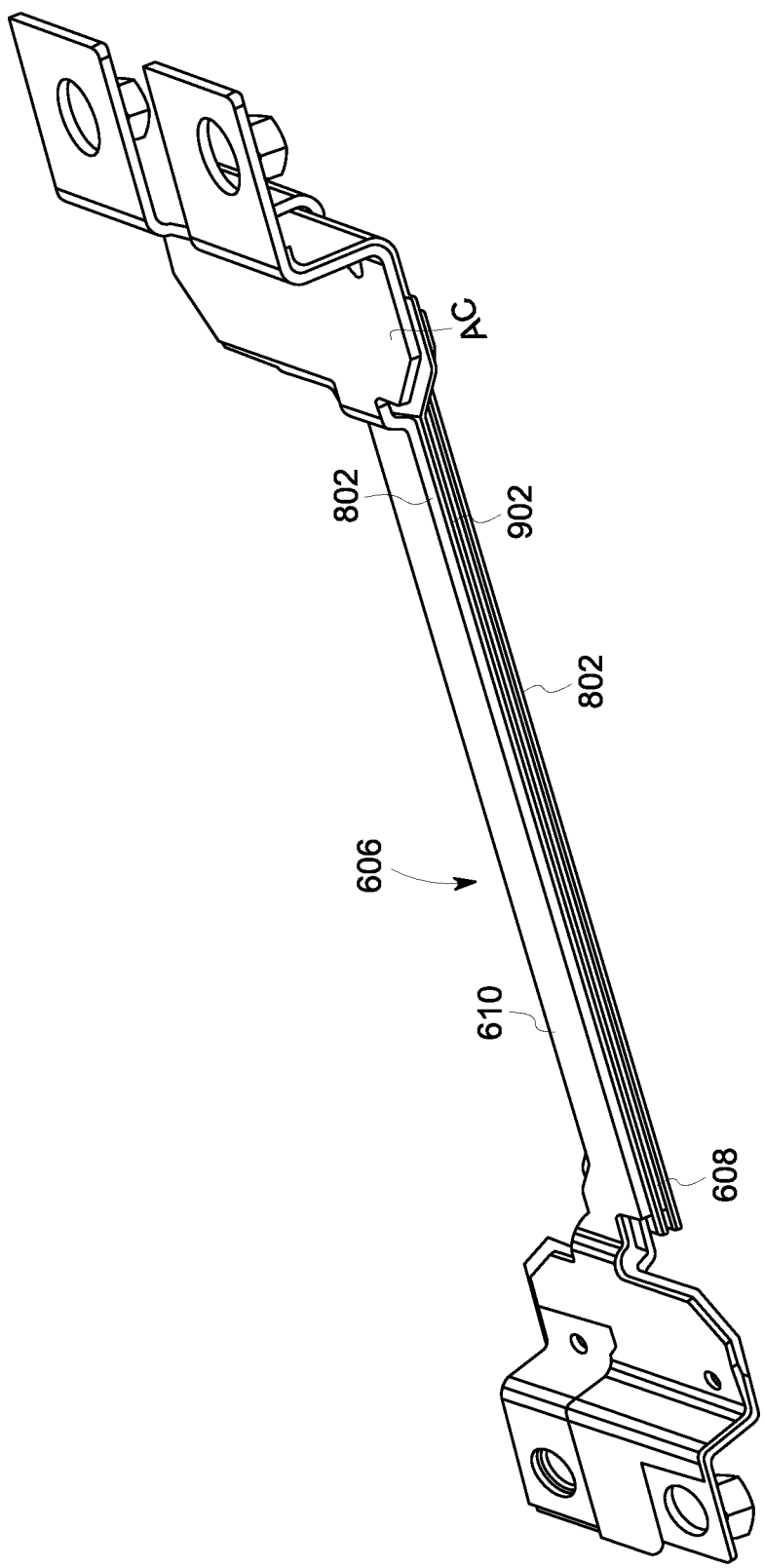
FIG. 8 is a perspective view of the laminated bus structure shown in FIG. 6 having a three-layer overlay configuration that may be used with the power module device shown in FIG. 6.

FIG. 8 is a perspective view of laminated bus structure 606 (shown in FIG. 6) having a three-layer overlay configuration that may be used with power module device 600 (shown in FIG. 6). In the exemplary embodiment, laminated bus structure 606 is configured to reduce the parasitic inductance for both main commutation power loop 302 (shown in FIG. 3) as well as a gate signal loop (not shown) from individual power switching devices 602 (shown in FIG. 6) to a respective driver 604 (shown in FIG. 6). To reduce the inductance, the current paths in and out of power module device 600 are maintained in close proximity with respect to each other so that an induced flux generated in each path when current flows through the modules are equal and opposite thus approximately canceling each other out and reducing the overall parasitic inductance seen by main commutation power loop 302. To avoid spacing and separation requirements when routing traces in the DBC, laminated bus structure 606 internal to power module device 600 is used. Laminated bus structure 606 permits positive bus 608 and negative bus 610 to be located on top of one another with only AC output bus 622 and electrical insulation layers 802 positioned between them. Electrical insulation layers 802 positioned between positive bus 608 and AC output bus 622 and between AC output bus 622 and negative bus 610 also facilitate reducing a distance between positive bus 608 and negative bus 610 to further reduce the inductance. In various embodiments, electrical insulation layer 802 is embodied in a polyimide film, flexible ceramics, hybrid polymer ceramic, and an adhesive, such as, but, not limited to, a fluoropolymer adhesive and a silicone compatible adhesive, such as, but, not limited to Kapton®.

Figure 9:
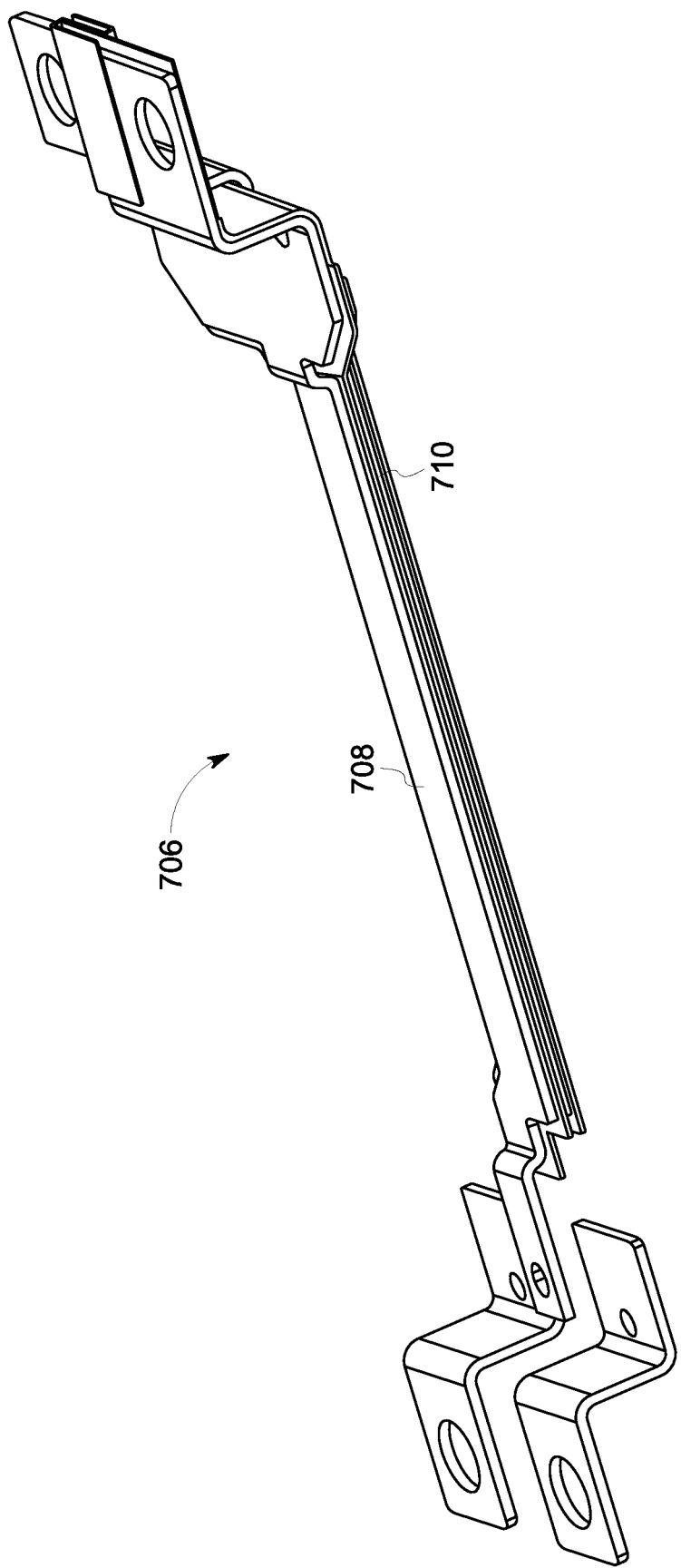
FIG. 9 is a perspective view of laminated bus structure having a two-layer overlay configuration that may be used with power module device shown in FIG. 7.

FIG. 9 is a perspective view of laminated bus structure 706 having a two-layer overlay configuration that may be used with power module device 700 (shown in FIG. 7). In the exemplary embodiment, laminated bus structure 706 is configured to reduce the parasitic inductance for both commutation power loop paths 408, 410, and 412 (shown in FIG. 4) as well as a gate signal loop (not shown) from individual power switching devices 702 (shown in FIG. 7) to a respective driver board 704 (shown in FIG. 7). To reduce the inductance, the current paths in and out of power module device 700 are maintained in close proximity with respect to each other so that an induced flux generated in each path when current flows through the modules are equal and opposite thus approximately canceling each other out and reducing the overall parasitic inductance seen by commutation power loop paths 408, 410, and 412. To avoid spacing and separation requirements when routing traces in the DBC, laminated bus structure 706 internal to power module device 700 is used. Laminated bus structure 706 permits positive bus 708 and negative bus 710 to be located directly on top of one another with only one or more electrical insulation layers 902 positioned between them. Electrical insulation layers 902 positioned between positive bus 708 and negative bus 710 also facilitate reducing a distance between positive bus 708 and negative bus 710 to further reduce the inductance. In various embodiments, electrical insulation layer 902 is embodied in a polyimide film, flexible ceramics, hybrid polymer ceramic, and an adhesive, such as, but, not limited to, a fluoropolymer adhesive and a silicone compatible adhesive, such as, but, not limited to Kapton®. An AC output is fully routed in the DBC and taken from AC terminals 904.

Figure 10:
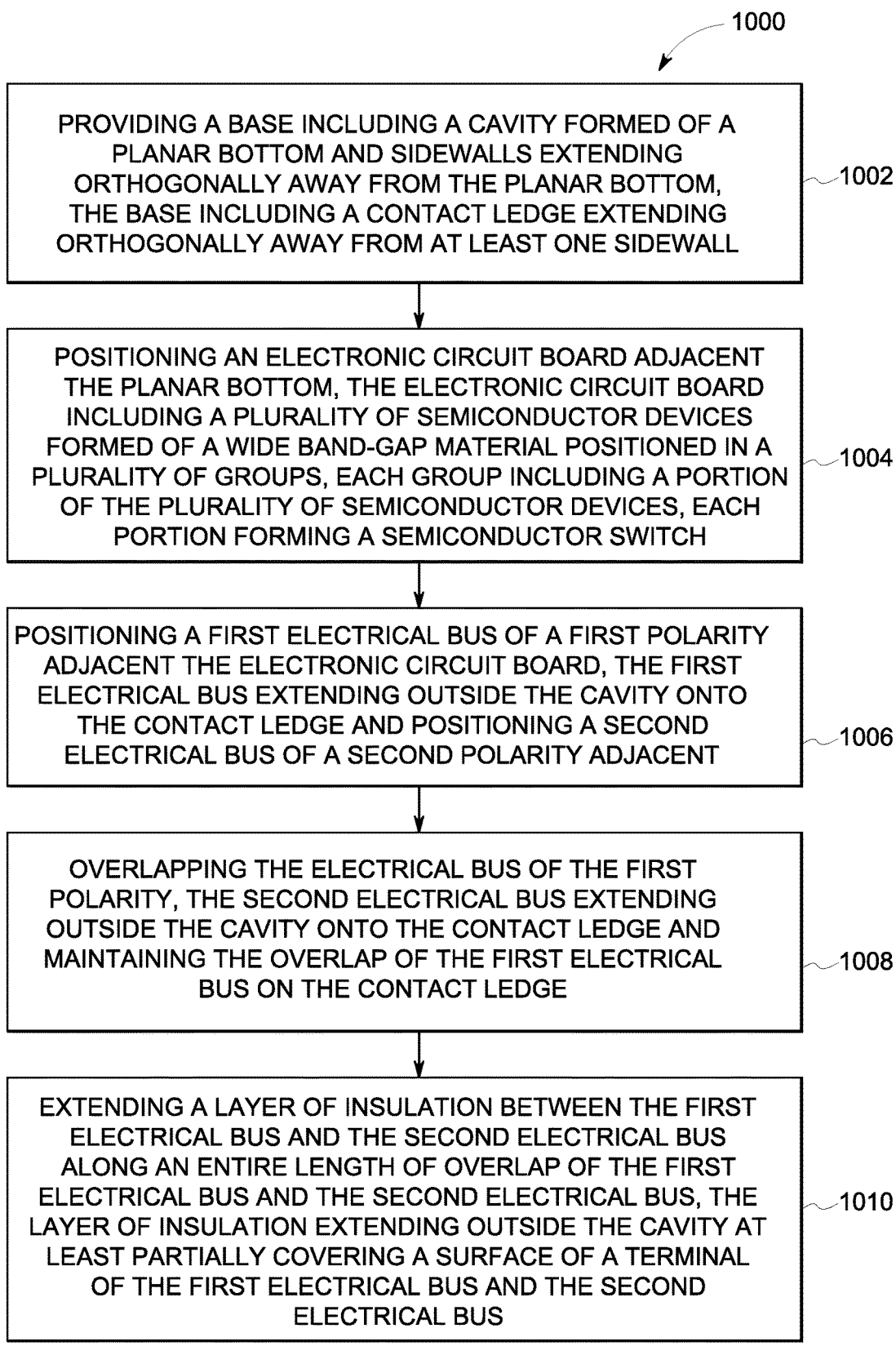
FIG. 10 is a flow chart of an exemplary method of forming the power module devices shown in FIGS. 6 and 7 in accordance with an exemplary embodiment of the present disclosure.

FIG. 10 is a flow chart of an exemplary method 1000 of forming power module devices 600 and 700 (shown in FIGS. 6 and 7, respectively). In the exemplary embodiment, method 1000 includes providing 1002 a base including a cavity formed of a planar bottom and sidewalls extending orthogonally away from the planar bottom, the base including a contact ledge extending orthogonally away from at least one sidewall and positioning 1004 a component board adjacent the planar bottom, the component board including a plurality of semiconductor devices formed of a wide band-gap material positioned in a plurality of groups, each group including a portion of the plurality of semiconductor devices, each portion forming a semiconductor switch. Method 1000 also includes positioning 1006 a first electrical bus of a first polarity adjacent the component board, the first electrical bus extending outside the cavity onto the contact ledge and positioning a second electrical bus of a second polarity adjacent and overlapping 1008 the electrical bus of the first polarity, the second electrical bus extending outside the cavity onto the contact ledge and maintaining the overlap of the first electrical bus on the contact ledge. Method 1000 further includes extending 1010 a layer of insulation between the first electrical bus and the second electrical bus along an entire length of overlap of the first electrical bus and the second electrical bus, the layer of insulation extending outside the cavity at least partially covering a surface of a terminal of the first electrical bus and the second electrical bus.

A technical advantage of laminated bus structure 606 is lower parasitic inductance in power module device 600, which results in a higher operating frequency capability, reduced voltage ringing, reduced losses, and higher voltage margin or capabilities due to reduced voltage spikes (traditional voltage spikes can be 50% or more with traditional silicon-based semiconductor modules switching at relatively slow speeds). With this configuration, the electrical power outputs and mechanical footprints do not have to change to benefit from this reduced inductance design.

Exemplary embodiments of methods, systems, and apparatus for reducing loop inductance in power switching circuits are not limited to the specific embodiments described herein, but rather, components of systems and/or steps of the methods may be utilized independently and separately from other components and/or steps described herein. For example, the methods may also be used in combination with other systems requiring reduced circuit inductance and the associated methods, and are not limited to practice with only the power inverters, switching modules, and methods as described herein. Rather, the exemplary embodiment can be implemented and utilized in connection with many other applications, equipment, and systems that may benefit from reduced circuit reactance.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power module device comprising:
   a base;
   a component board comprising a plurality of gated switches formed of a semiconductor material;
   a laminated bus structure comprising:
      a first elongate electrical bus member configured to connect to a voltage source having a first polarity, said first elongate electrical bus member having a first length, a first width, and a first thickness, the first length being substantially greater than the first width and the first width being substantially greater than the first thickness;
      a second elongate electrical bus member configured to connect to a voltage source having a second polarity, said second elongate electrical bus member having a second length, a second width, and a second thickness, the second length being substantially greater than the second width and the second width being substantially greater than the second thickness, said second elongate electrical bus member positioned in a nested face-to-face configuration with respect to said first elongate electrical bus member; and
      a layer of electrical insulation positioned between said first elongate electrical bus member and said second elongate electrical bus member; and
      an output bus layer positioned between said first elongate electrical bus member and said second elongate electrical bus member.

2. The power module device of claim 1, wherein said semiconductor material comprises a wide band gap semiconductor material.

3. The power module device of claim 1, wherein said power module device is configured such that a first current flowing in said first elongate electrical bus member is approximately equal in magnitude and opposite in direction to a second current flowing in said second elongate electrical bus member.

4. The power module device of claim 1, wherein the plurality of gated switches comprise a plurality of at least one of metal oxide semiconductor field effect transistors (MOSFET), insulated-gate bipolar transistors (IGBT), junction gate field-effect transistors (JFET), and bipolar junction transistors (BJT) formed of a wide band gap semiconductor material.

5. The power module device of claim 1, wherein said layer of electrical insulation comprises polyimide film and silicone adhesive.

6. The power module device of claim 1, wherein said second elongate electrical bus member partially overlaps said first elongate electrical bus member such that a wire bonding ledge of said second elongate electrical bus member is exposed for bonding.

7. An inverter system comprising:
   a direct current (DC) power source;
   a power switching module electrically coupled to said DC power source, said power switching module configured to receive DC power from said DC power source and generate alternating current (AC) output, said power switching module comprising:
      a base;
      a circuit board comprising a plurality of gated switches formed of a wide band gap semiconductor material;
      a first elongate electrical bus member configured to connect to a voltage source having a first polarity, said first elongate electrical bus member having a first length, a first width, and a first thickness, the first length being substantially greater than the first width and the first width being substantially greater than the first thickness;
      a second elongate electrical bus member configured to connect to a voltage source having a second polarity, said second elongate electrical bus member having a second length, a second width, and a second thickness, the second length being substantially greater than the second width and the second width being substantially greater than the second thickness, said second elongate electrical bus member positioned in a nested face-to-face configuration with respect to said first elongate electrical bus member;
      a layer of electrical insulation positioned between said first elongate electrical bus member and said second elongate electrical bus member; and
      an output bus layer positioned between said first elongate electrical bus member and said second elongate electrical bus member.

8. The inverter system of claim 7, wherein said wide band gap semiconductor material comprises silicon carbide.

9. The inverter system of claim 7, wherein said power module device is configured such that a first current flowing in said first elongate electrical bus member is approximately equal in magnitude and opposite in direction to a second current flowing in said second elongate electrical bus member.

10. The inverter system of claim 7, wherein the plurality of gated switches comprise a plurality of metal oxide semiconductor field effect transistors (MOSFET) formed of a wide band gap semiconductor material.

11. The inverter system of claim 7, wherein said layer of electrical insulation comprises a polyimide film, flexible ceramics, hybrid polymer ceramic, and at least one of a fluoropolymer adhesive and a silicone adhesive.

12. The inverter system of claim 7, wherein said second elongate electrical bus member partially overlaps said first elongate electrical bus member such that a wire bonding ledge of said second elongate electrical bus member is exposed for bonding.

* * * * *